(12) United States Patent
Liao et al.

(10) Patent No.: US 11,600,572 B2
(45) Date of Patent: Mar. 7, 2023

(54) ROUTING STRUCTURE BETWEEN DIES AND METHOD FOR ARRANGING ROUTING BETWEEN DIES

(71) Applicants: Global Unichip Corporation, Hsinchu (TW); Taiwan Semiconductor Manufacturing Company, Ltd., Hsinchu (TW)

(72) Inventors: Wei-Chieh Liao, Hsinchu (TW); Hao-Yu Tung, Hsinchu (TW); Yu-Cheng Sun, Hsinchu (TW); Ming-Hsuan Wang, Hsinchu (TW); Igor Elkanovich, Hsinchu (TW)

(73) Assignees: Global Unichip Corporation, Hsinchu (TW); Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/198,262

(22) Filed: Mar. 11, 2021

(65) Prior Publication Data

US 2022/0293526 A1  Sep. 15, 2022

(51) Int. Cl.
  *H01L 23/538* (2006.01)
  *H01L 25/065* (2023.01)
  *H01L 25/00* (2006.01)
  *H01L 21/48* (2006.01)
  *H01L 23/498* (2006.01)

(52) U.S. Cl.
  CPC ........ *H01L 23/5386* (2013.01); *H01L 21/485* (2013.01); *H01L 23/49838* (2013.01); *H01L 25/0655* (2013.01); *H01L 25/50* (2013.01)

(58) Field of Classification Search
  None
  See application file for complete search history.

(56) References Cited

FOREIGN PATENT DOCUMENTS

| CN | 112133687 | 12/2020 |
|---|---|---|
| TW | 201403784 | 1/2014 |
| TW | 201535030 | 9/2015 |
| TW | 202024738 | 7/2020 |

OTHER PUBLICATIONS

Office Action of Taiwan Counterpart Application, dated Dec. 13, 2021, pp. 1-3.

*Primary Examiner* — Long Pham
(74) *Attorney, Agent, or Firm* — JCIPRNET

(57) ABSTRACT

A routing structure between dies is provided, including a trace layer, disposed on a substrate, wherein a plurality of routing paths is embedded in the trace layer. In addition, a first die and a second die are disposed on the trace layer and connected by the routing paths. A spacing gap between the first die and the second die is along a first direction and interfacing edges of the first die and the second die are extending along a second direction perpendicular to the first direction. Each of the routing paths includes a first straight portion in parallel to connect to the interfacing edges. The first straight portion has a slant angle with respect to the first direction other than 0° and 90°.

20 Claims, 11 Drawing Sheets

ROUTING STRUCTURE BETWEEN DIES AND METHOD FOR ARRANGING ROUTING BETWEEN DIES

BACKGROUND

Technical Field

The invention is related to interface between two integrated circuit (IC) dies for data communication and more particularly to a routing between the IC dies.

Description of Related Art

The digital electronic apparatus based on semiconductor integrated circuit such as mobile phones, digital cameras, personal digital assistants (PDAs), and so on are designed to have to be more powerful functionalities to adapt various applications in the modern digital world. However, the digital electronic apparatus as the trend in semiconductor fabrication intends to be smaller and lighter, with improved functionality and higher performance. The semiconductor device may be packaged into a 2.5D semiconductor device, in which several circuit chips may be integrated as a larger integrated circuit, in which the contact elements, interposer or RDL layer are used to connect between the chips.

The packaging technology Integrated Fan-Out (InFO) and chip-on-wafer-on-substrate (CoWoS) have been proposed to package multiple chips assembled side by side.

As to a whole electronic circuit, the main circuit fabricated as a master die in an example may need to connect to multiple slave dies as an example. Due to the condition of the packaging technology, the spacing gap between the die is fixed. The routing structure between the dies needs to be set within the spacing gap. In other words, the spacing gap has its limitation in maximum and minimum under the packaging requirement. Over large spacing gap may cause a large packaging size and would usually be not intended. Over small spacing gap may cause a small packaging size and would have difficulty to fabricate.

Due to the limited size of the spacing gap, the number of the paths of the routing structure may be limited. Here, each path is to connect two contact elements, such as the bonding pads of the two dies to be connected. The routing structure, as usually formed in the physical layer of the die, is serving like an interface bus and the number of the paths is the size of the interface bus. The routing structure is fabricated in an interposer or a redistribution layer (RDL). The dies to be connected are disposed on the interposer or the RDL layer. The routing structure connects the contact elements between the dies and serves as an interface bus. The number of the paths of the routing structure would greatly increase when the dies are designed to have more capability, resulting in more information to be communicated between the dies through the interface bus.

Due to the spacing gap between the dies is limited due to the packaging technology, the number of the paths may also be limited due to the improper routing structure. How to design the routing structure to increase the size of the interface bus is still an issue to improve.

SUMMARY

The invention provides a routing structure between dies, in which the routing paths may be slant. The routing paths in wire length, wire width and wire pitch respectively may by the same.

In an embodiment, the invention provides a routing structure between dies is provided. The routing structure between dies may include: a trace layer, disposed on a substrate, wherein a plurality of routing paths is embedded in the trace layer; and a first die and a second die, disposed on the trace layer and connected by the routing paths. A spacing gap between the first die and the second die is along a first direction and interfacing edges of the first die and the second die are extending along a second direction perpendicular to the first direction. Each of the routing paths connects between the interfacing edges of the first die and the second die, and includes a first straight portion, a second straight portion and a third straight portion in sequence, and is equal in a wire width and a wire length. The first straight portion and the third straight portion are extending along the first direction. Each of the second straight portions has a first slant angle with respect to the first direction other than 0° and 90°. Joining interfaces between the first straight portion and the second straight portion and between the second straight portion and the third straight portion have an included angle from the second direction to maintain the wire width being equal.

In an embodiment, the invention also provides a method for arranging routing structure between dies. The method may include: disposing a trace layer on a substrate, wherein a plurality of routing paths is embedded in the trace layer; and disposing a first die and a second die on the trace layer as connected by the routing paths. A spacing gap between the first die and the second die is along a first direction and interfacing edges of the first die and the second die are extending along a second direction perpendicular to the first direction. Each of the routing paths connects between the interfacing edges of the first die and the second die, and includes a first straight portion, a second straight portion and a third straight portion in sequence, and is equal in a wire width and a wire length. The first straight portion and the third straight portion are extending along the first direction. Each of the second straight portions has a first slant angle with respect to the first direction other than 0° and 90°. Joining interfaces between the first straight portion and the second straight portion and between the second straight portion and the third straight portion have an included angle from the second direction to maintain the wire width being equal.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

The invention is directed to an interface between two integrated circuit (IC) dies for data communication, in which the routing structure between the IC dies are arranged to adapt more routing paths, resulting in a larger size of interface bus in an example. The contact elements of the two dies are correspondingly connected through connection interface, such as interposer or re-distribution layer (RDL) depending on the package process as taken. The routing structure is embedded in the interposer or the RDL layer. The contact elements may be the contact pad or bump pad in an example.

Several embodiments are provided for describing the invention but the invention is not just limited to the embodiments.

The whole integrated circuit may be fabricated by the semiconductor fabrication processes as a semiconductor device, which may be fabricated based on stack structure of 2.5D semiconductor device. In an embodiment, the interface of the dies to receive data may include the frame decoding circuit in association with the de-serialized circuit. In an embodiment, the interface in semiconductor structure is integrated in the circuit of the whole die. The dies in communication in an embodiment may be a master die of processing circuit and a slave die of memory die. In other words, the types of dies are not limited to the specific type. However, the dies are communicating through the interface with the routing structure, which include a plurality routing paths.

Figure 1:
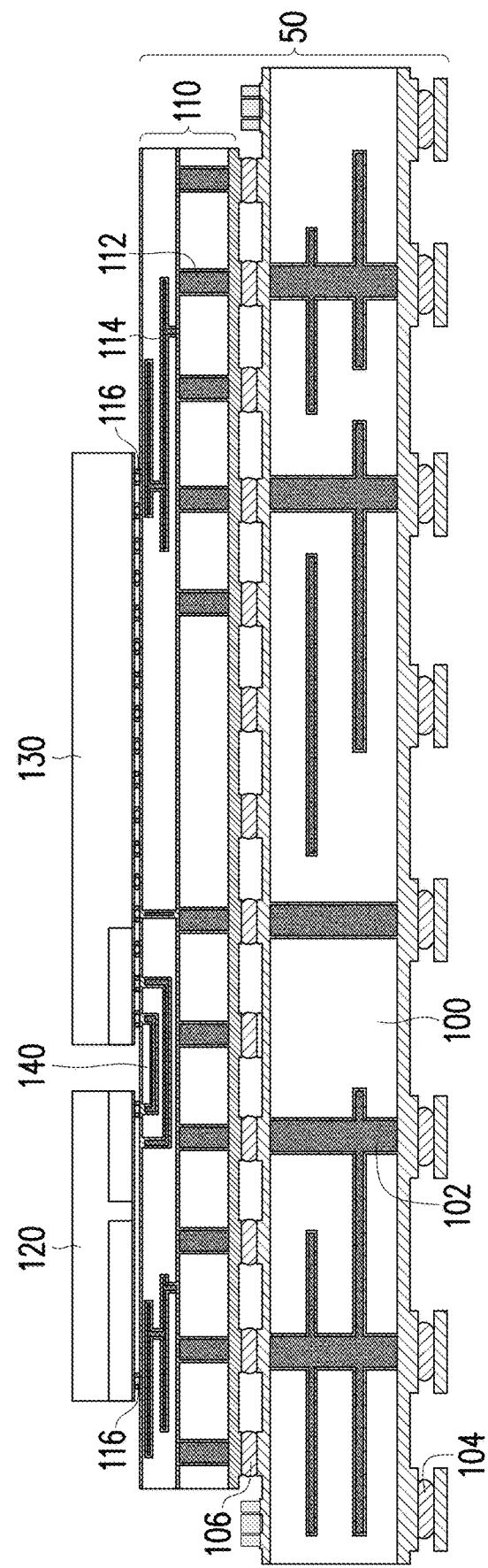
FIG. 1 is a drawing, schematically illustrating a cross-sectional stack structure of 2.5D semiconductor device with an interface, according to an embodiment of the invention.

The general semiconductor fabrication is firstly described. FIG. 1 is a drawing, schematically illustrating a cross-sectional stack structure of 2.5D semiconductor device with an interface, according to an embodiment of the invention. Referring to FIG. 1, in further application, the CoWoS or InFO platform 50 with the intended IC structure is formed based on the 2.5D packaging technology. The CoWoS or InFO platform 50 may include a package substrate 100, which has the bottom solder balls 104 and the top contact elements 106. The via 102 may be used for connecting from the bottom solder balls 104 to the top contact elements 106. Further, a trace layer 110, such as the interposer or RDL, may be further formed on the substrate 100 with the connection of the contact elements 106. The routing structure 140 with the routing paths in embedded in the trace layer 110 for connection. The trace layer 110 may also include the TSV 112, the interconnection routing 114, and the contact elements 116. Here, the contact elements 116 depending on the fabrication process as taken may be via or contact element or any suitable connecting structure for terminal-to-terminal in contact. The invention does not limit the contact elements 106 as a specific type.

In actual application, the CoWoS or InFO platform 50 may also be implemented with additional dies, such as the processor die 130 and memory die 120 or other type of die without limitation to. The processor die 130 and memory die 120 are connected through the routing structure 140 embedded in the trace layer 110.

The routing structure may have various arrangements. The invention has looked into the usual routing structures and further provides the improved routing structure, which may adapt more routing paths within a spacing gap between the dies as set by the packaging process.

Figure 2:
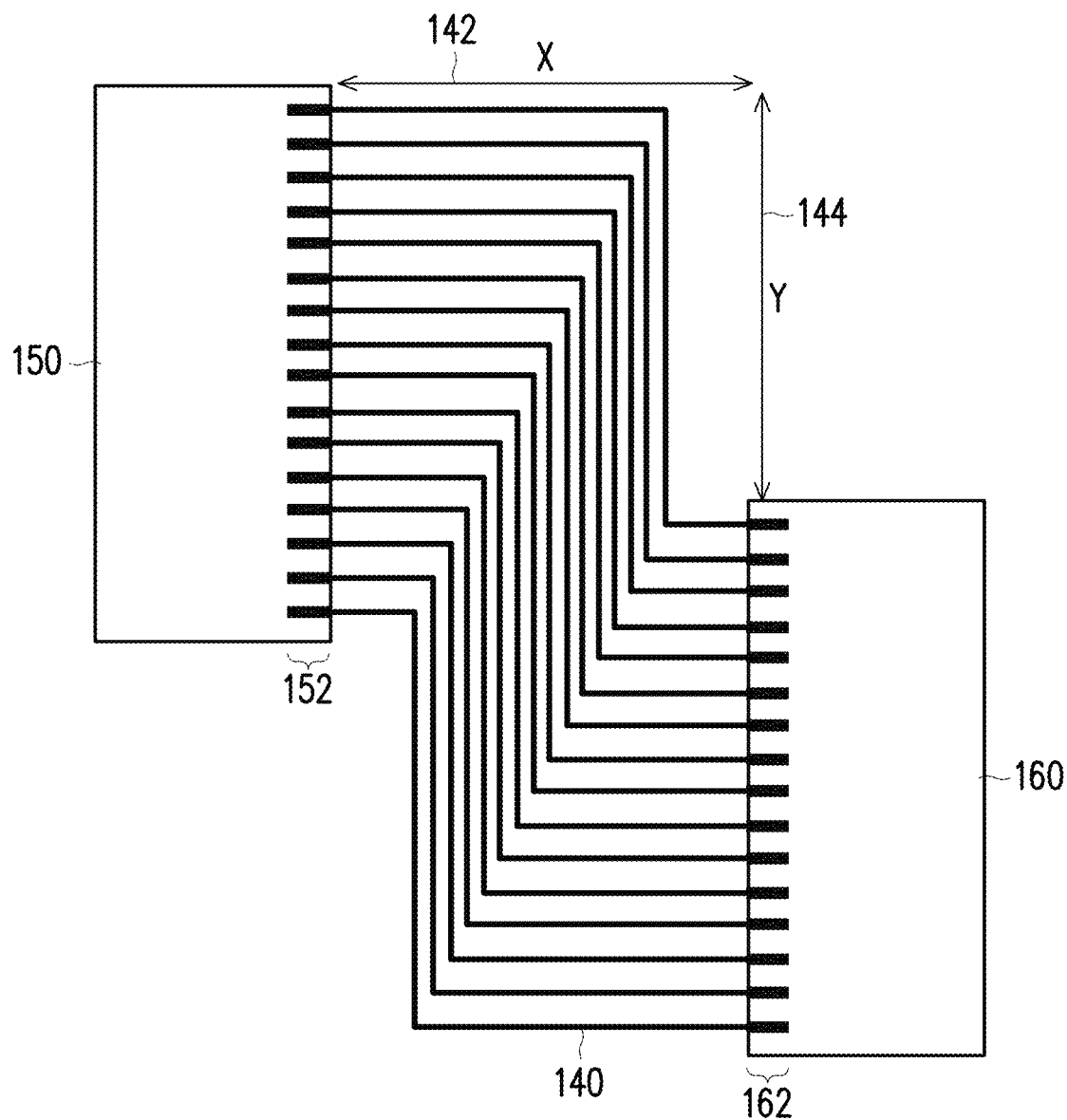
FIG. 2 is drawing, schematically illustrating a routing structure between dies as looked into, according to an embodiment in the invention.

FIG. 2 is drawing, schematically illustrating a routing structure between dies as looked into, according to an embodiment in the invention. Referring to FIG. 2, the die 150 and the die 160 are to be connected through the routing structure 140. Due to the packaging process, a spacing gap 142 along the X direction is set. However, a shift 144 between the die 150 and the die 160 along the Y direction may be arranged. The die 150 has an interfacing edge 152, which is a part of a physical layer of the die 150. The interfacing edge 152 include a number of contact elements, which form a pad pattern to be connected out. Likewise, the die 160 has an interfacing edge 162, which is a part of a physical layer of the die 160. The interfacing edge 152 and the interfacing edge 162 are connected by the routing structure 140, which include the same number of the contact elements, serving like a parallel bus in connection between the die 150 and the die 160.

Each routing path of the routing structure 140 in a straightforward manner may include three portions. The central portion is extending along the Y direction withing the spacing gap 142. The ends of the central portion are connected with the portions extending along the X direction. The shift 144 may be more freely set but the spacing gap 142 is restricted by the packaging process. In this case, the size the spacing gap 142 is fixed. Due to the spacing between the central portion of the routing paths has also a limitation in packaging process, the spacing gap 142 cannot adapt a large number of routing paths without limitation. In this situation, the number of the routing paths of the routing structure 140 would also be limited.

Figure 3:
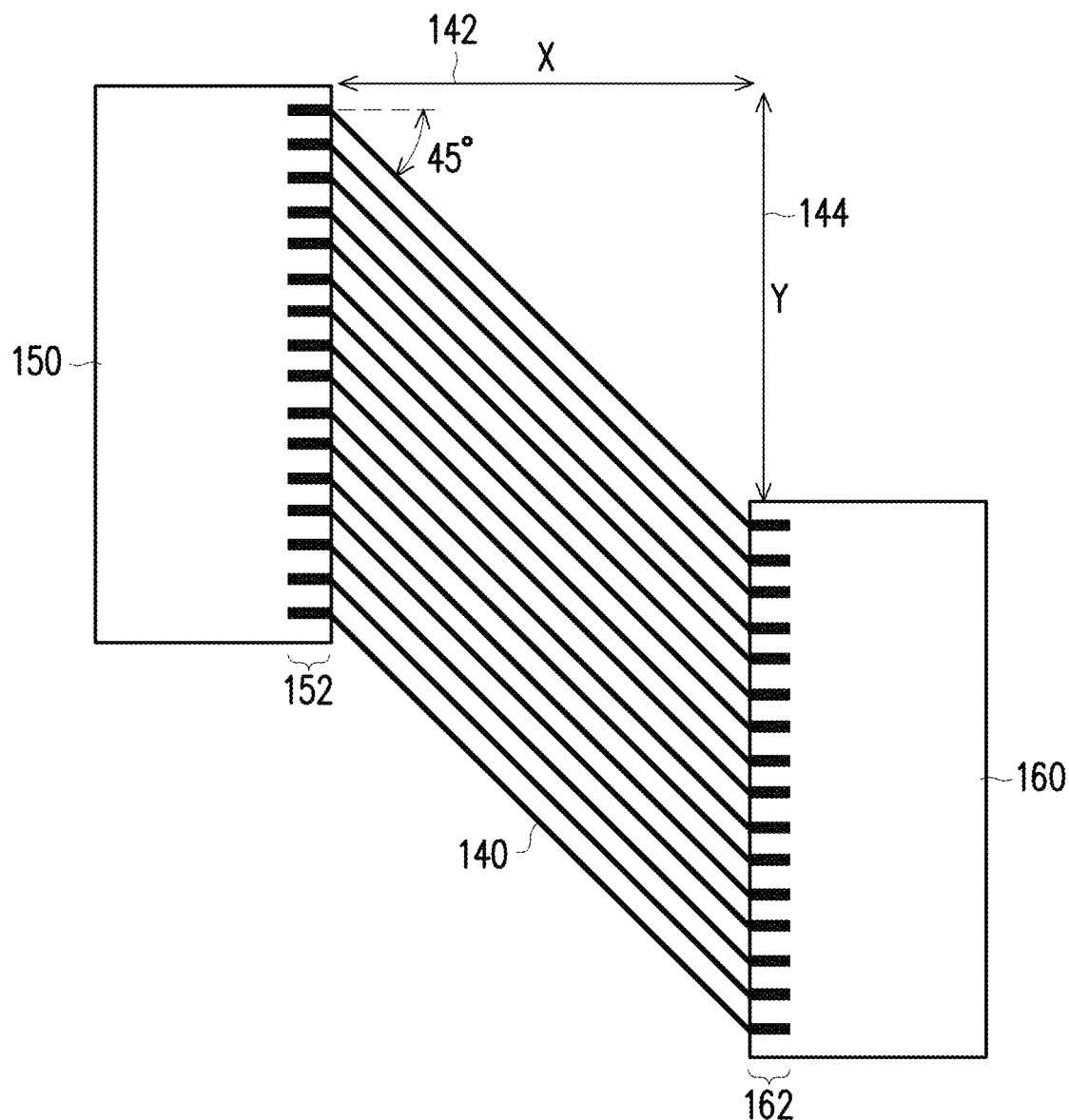
FIG. 3 is drawing, schematically illustrating a routing structure between dies as looked into, according to an embodiment in the invention.

FIG. 3 is drawing, schematically illustrating a routing structure between dies as looked into, according to an embodiment in the invention. Referring to FIG. 3, another straightforward design of the routing structure 140 is setting the routing paths to be slant by a constant degree of 45° with respect to the X direction. The length of the routing path may be shorter. However, the spacing gap 142 would be equal to shift 144. The shift 144 is fixed in this design.

Figure 4:
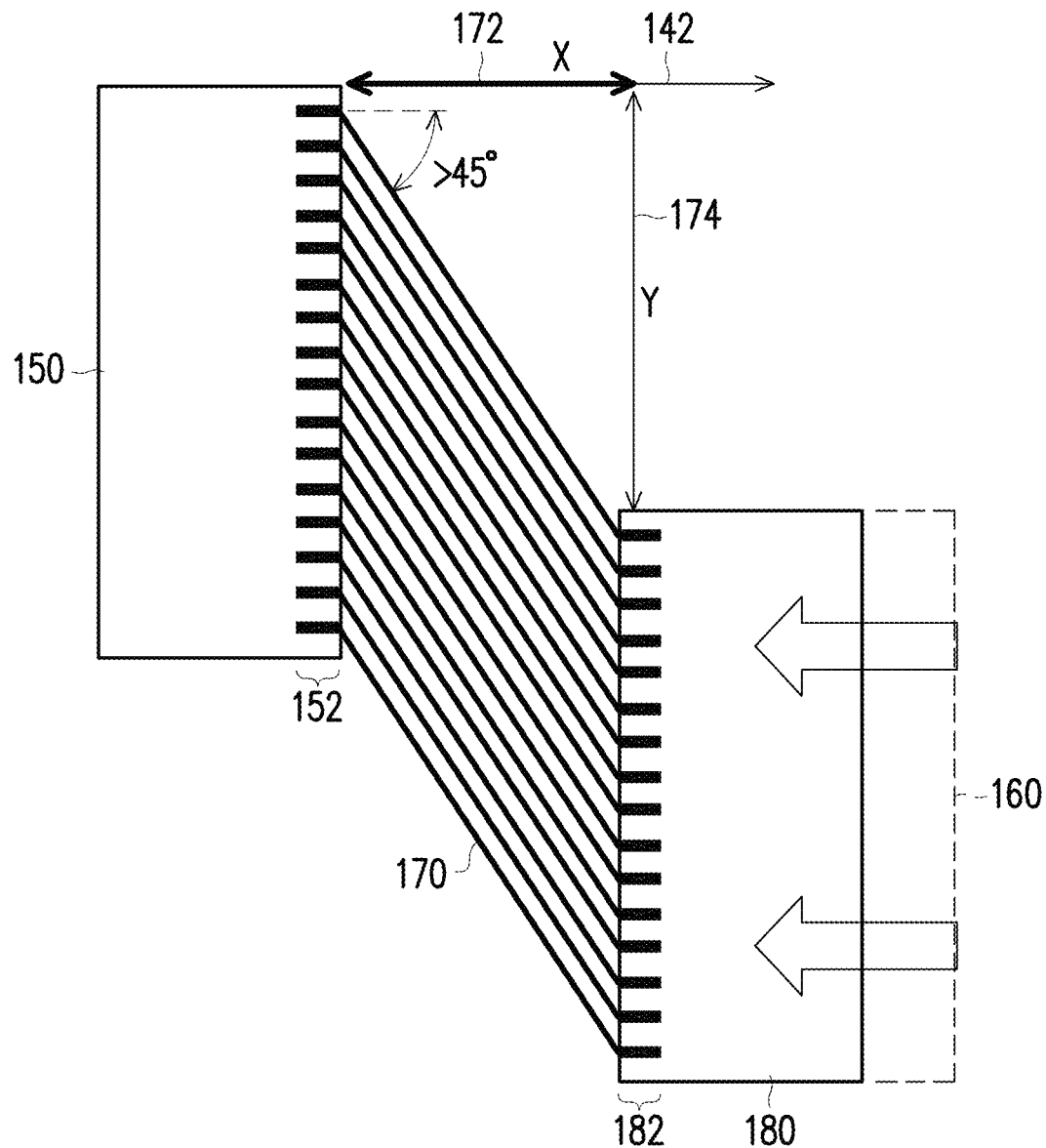
FIG. 4 is a drawing, schematically illustrating a routing structure between dies, according to an embodiment of the invention.

FIG. 4 is a drawing, schematically illustrating a routing structure between dies, according to an embodiment of the invention. Referring to FIG. 4, in a further embodiment, the routing structure 170 may include the routing paths, which are parallel but slant with respect to the X direction by any angle other than 0° and 90°. The routing paths of the routing structure 170 is not limited to a constant slant angle with respect to the X direction. In this manner, the die 160 in an example may be moved backward in the X direction, as indicated by the arrows, in an embodiment. The original spacing gap 142 may be reduced to the spacing gap 172. In the embodiment, the rout paths of the routing structure 170 is greater than 45°. In other words, the location of the die 180 with the interface edge 182 over the substrate 100 may be more freely adjusted along the X direction without constraint to the spacing gap 142 at the X direction.

Here, the die 150 in an embodiment may be a master die kept at the fixed location and the die 180 is a slave die at periphery of the die 150 and the location of the die 180 allows more flexible adjustment in location. However, the invention is not juts limited to the embodiment. The dies 150 may also be moved within the adjustment tolerance.

Figure 5:
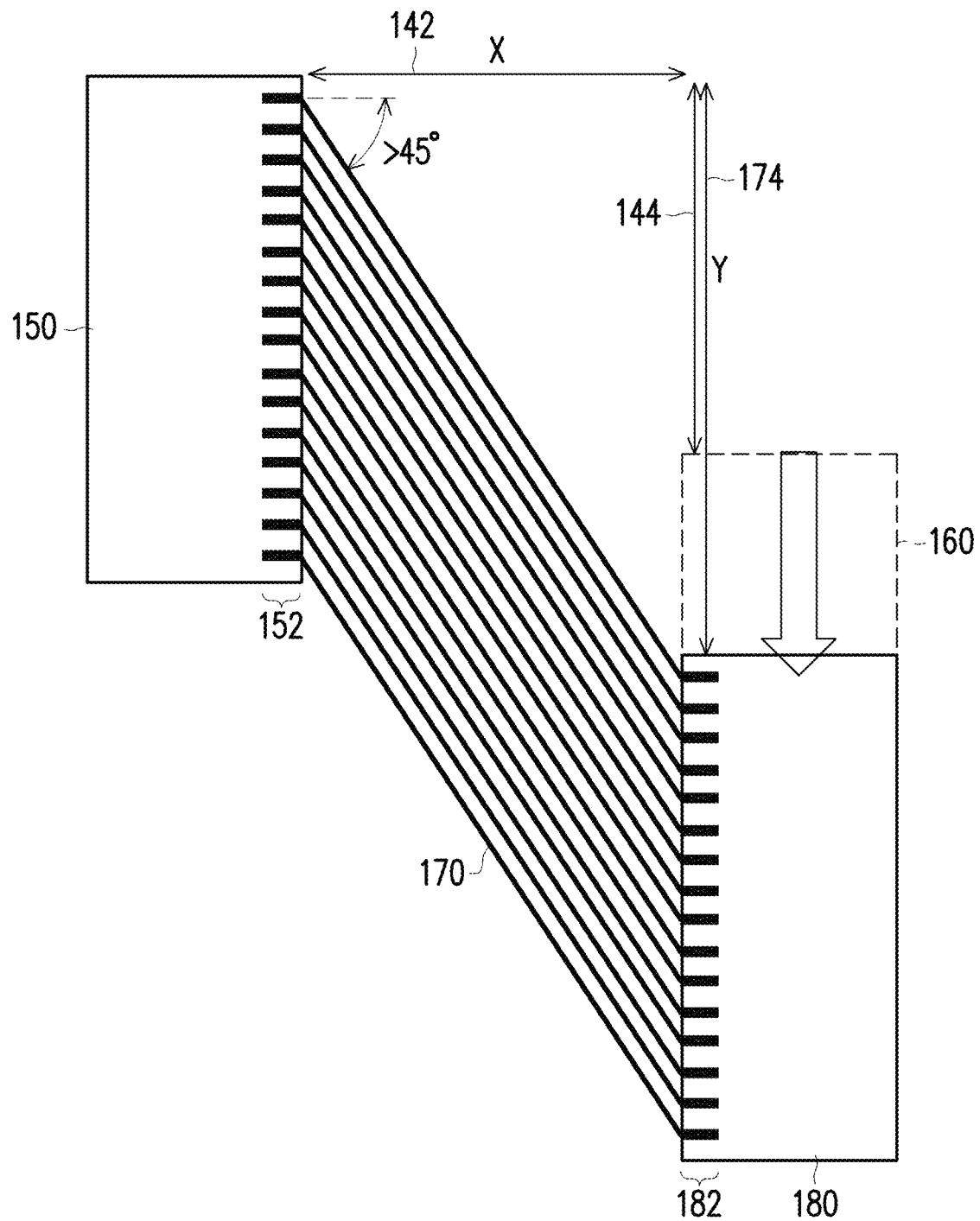
FIG. 5 is a drawing, schematically illustrating a routing structure between dies, according to an embodiment of the invention.

Further in an embodiment, FIG. 5 is a drawing, schematically illustrating a routing structure between dies, according to an embodiment of the invention. Referring to FIG. 5, in comparison with FIG. 3, the original shift 144 at the Y direction may be adjusted to the shift 174, according to the location of the die 180.

As to the forgoing embodiments, the routing paths of the routing structure 180 has the slant angle greater than 45°. In an embodiment, the slant angle may be less than 45°. In an example, the slant angle may be in a range of 10° to 80°, which allow the peripheral dies 180 to be located at the proper locations with less constraint in the X direction and/or Y direction.

Figure 6:
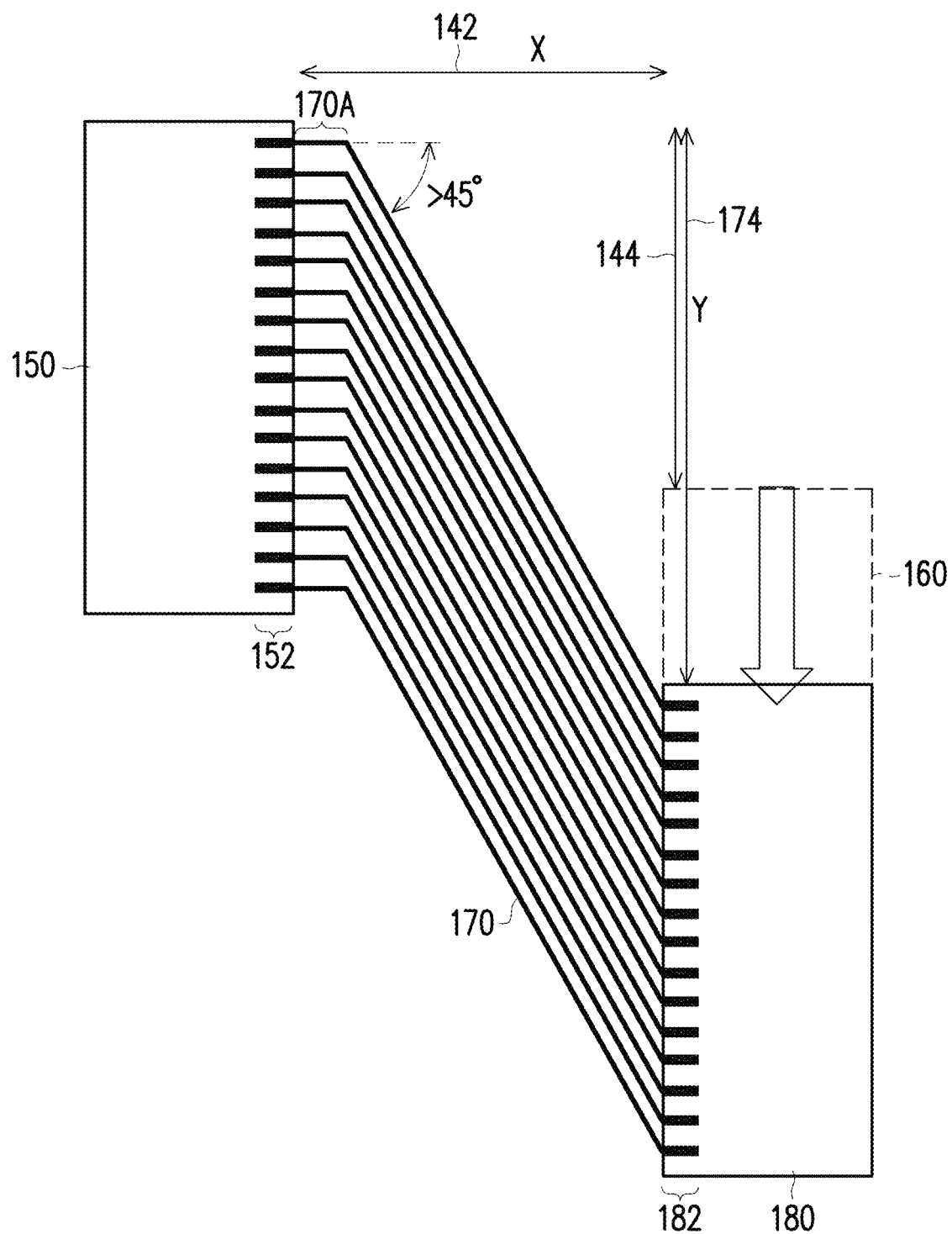
FIG. 6 is a drawing, schematically illustrating a routing structure between dies, according to an embodiment of the invention.

In further embodiment, FIG. 6 is a drawing, schematically illustrating a routing structure between dies, according to an embodiment of the invention. Referring to FIG. 6, the rout paths of the routing structure 170 may further include a portion 170A, which extends along the X direction from the interfacing edge 152 of the die 150, according to the actual need. In addition, the portion 170A may also be set to the die 180 or both the die 150 and the die 180.

Figure 7:
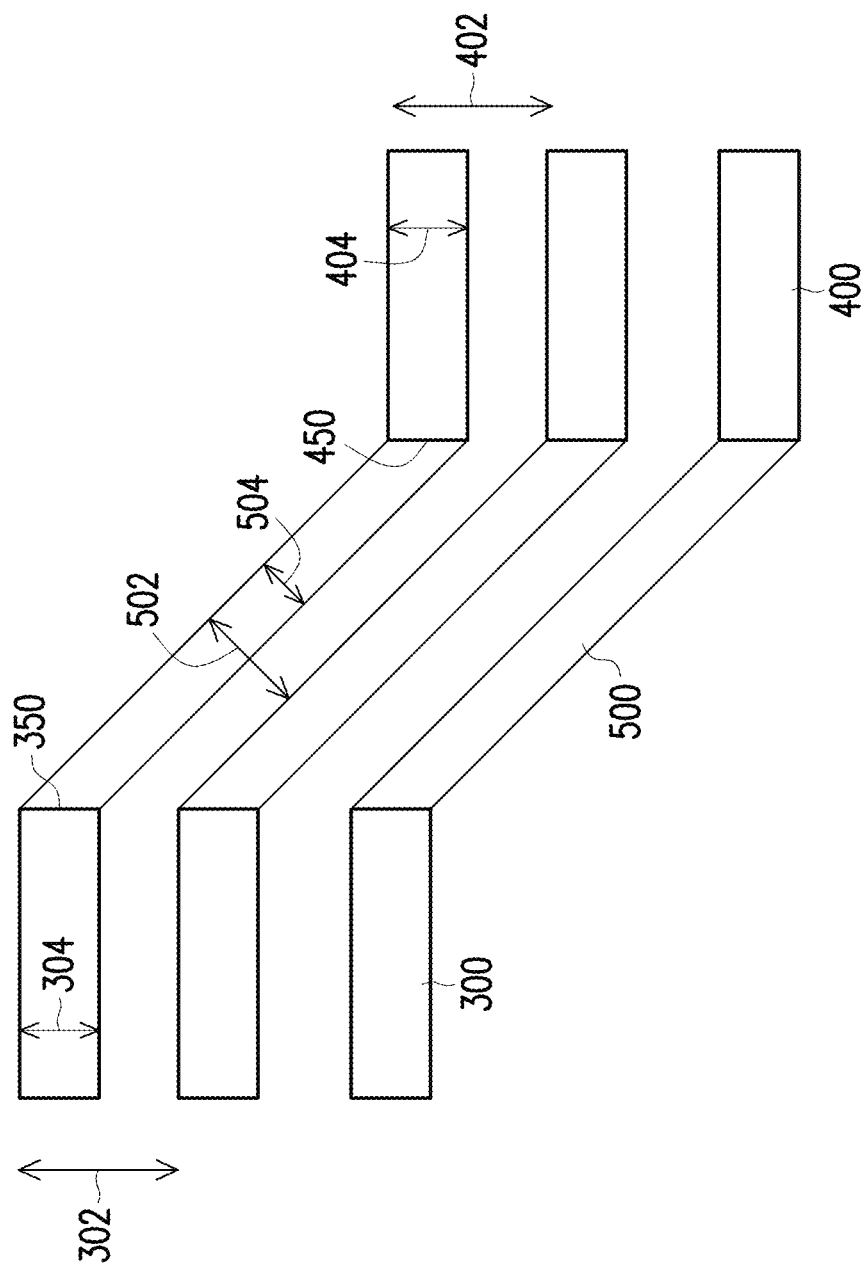
FIG. 7 is a drawing, schematically illustrating a routing structure between dies, according to an embodiment of the invention.

As noted, the signals are parallel transmitted through the routing structure 170. To have the signals as transmitted with about the same signal quality not affect from the deviation due to wiring effect of the routing structure, such as the wire length or the RC resonance between the wire, the wire length, the wire width and the wire pitch need to be further consideration, in an embodiment. FIG. 7 is a drawing, schematically illustrating a routing structure between dies, according to an embodiment of the invention.

Referring to FIG. 7, some wire effects have been looked into in the invention. One routing path may include a first straight portion 300, a second straight portion 500 and a third straight portion 400 in sequence. In an embodiment, the first straight portion 300 may be involved in the interface edge of one die and the third straight portion 300 may be involved in the interface edge of another die but servers as a part of the whole routing path.

The first straight portion 300 may have uniform wire pitch 302 and width 304. Likewise, the third straight portion 400 may have uniform wire pitch 402 and width 404, the same as the first straight portion 300. Here, the joining interface 350 between the first straight portion 300 and the second straight portion 500 is usually extending along the Y direction. The joining interface 450 between the third straight portion 400 and the second straight portion 500 is also usually extending along the Y direction. If the second straight portion 500 with the slant angle is connecting between the first straight portion 300 and the third straight portion 400, the wire pitch 502 and the wire width 504 would be reduced.

This situation in FIG. 7 may affect the signal quality as transmitted. The wire width and the wire pitch of the routing path are intended to keep the same. To have the property, the joining interfaces 350, 450 need to be adjusted.

Figure 8:
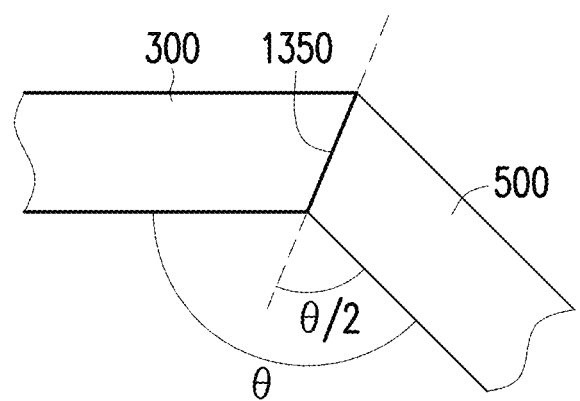
FIG. 8 is a drawing, schematically illustrating the joining mechanism between two straight portions of the routing structure, according to an embodiment of the invention.

FIG. 8 is a drawing, schematically illustrating the joining mechanism between two straight portions of the routing structure, according to an embodiment of the invention. Referring to FIG. 8, the joining interface 1350 between the first straight portion 300 and the second straight portion 500 is taken as an example to keep the same wire width. Here, an included angle between the first straight portion 300 and the second straight portion 500 is θ, then the joining interface 1350 in an example is set at the central line of the included angle θ. In this situation, the first straight portion 300 and the second straight portion 500 may have equal width.

Figure 9:
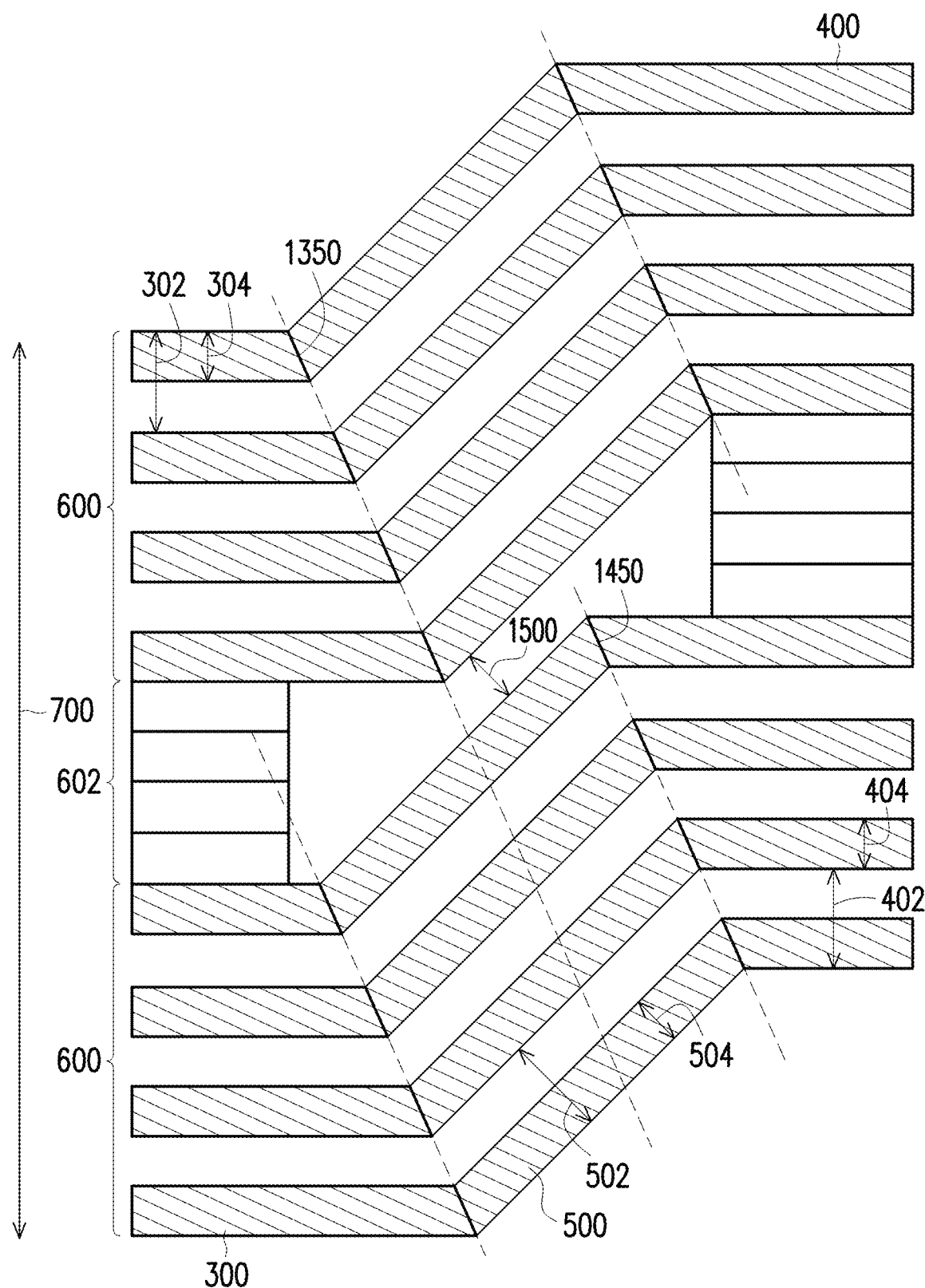
FIG. 9 is a drawing, schematically illustrating a routing structure between dies, according to an embodiment of the invention.

The mechanism in FIG. 8 may be applied to FIG. 7 for further modification. FIG. 9 is a drawing, schematically illustrating a routing structure between dies, according to an embodiment of the invention.

Referring to FIG. 9, in an embodiment, the whole routing path may include a first straight portion 300, a second straight portion 500 and a third straight portion 400 in a sequence from one die to another die to be connected. Here, in an embodiment, the first straight portion 300 and the third straight portion 400 may be implemented in the interface edges of the dies but the invention is not just limited to. In an embodiment, the first straight portion 300, a second straight portion 500 and a third straight portion 400 may be implemented in the interposer.

As to the routing paths 300 in the wire region 600, the joining interface 1350 between the first straight portion 300 and the second straight portion 500 are set, according to the mechanism in FIG. 8. Likewise, joining interface 1450 between the third straight portion 400 and the second straight portion 500 are set as well. The wire width 304, the wire width 504 and the wire width 404 are equal. Also, the wire pitch 302, the wire pitch 402, and the wire pitch 502 are also equal.

In an embodiment, to have equal length for the routing path, the length of the second straight portion 500 may set to be equal. With the same mechanism, the length of the third straight portions 400 are decreasing in opposite way with respect to the Y direction. The second straight portions 500 may be equal in length and/or in wire pitch 502 as disposed in parallel. However, the first straight portion 300 of the routing path may gradually increase. Accordingly, in opposite way, the third straight portion 400 is gradually decrease. Due to a limitation of the spacing gap between the die at the X direction, the third straight portion 400 may be reduced to zero, in which the second straight portion 400 may reach to a certain quantity as designed. Then another wire region 600 may be disposed again with the same mechanism.

In other words, the routing paths may be divided into two groups corresponding to two wire regions 600. Also noted, to keep the same wire pitch between the two wire region 600, a spacing 1500 may be properly set according to the geometric condition of the routing paths with the slant angle. In an embodiment, to have keep the same wire pitch between the last routing path of one wire region 600 and the beginning routing path of the next wire region 600, the spacing 1500 is set to the difference between the wire pitch 502 and the wire width 504. As also noted, in this manner, the function region 602 in the interface edge may be set between the two wire regions 600. The function region 602 in an example includes power pad and/or the ground pad, other than the digital signals transmitted in the wire regions 600.

Further in an embodiment, the length of the first straight portion 300 in different wire region may also allow a proper shift, so as to have the proper spacing 1500 as needed. In other words, this geometric parameters may be accordingly adjusted depending on the slant angle of the second straight portion 500 as set. The wire width may maintain the same. The wire pitch in each wire region may also maintain the same. In addition, the spacing 1500 is also set to have the same wire pitch between two wire regions 600.

In an example, taking the data with a size of 8-bit to be transmitted, four bits are set as one wire region 600 and the power/ground pads are set to the functional region 602 between the two wire regions 600. The signal quality may be more uniform for these 8-bit data.

Figure 10:
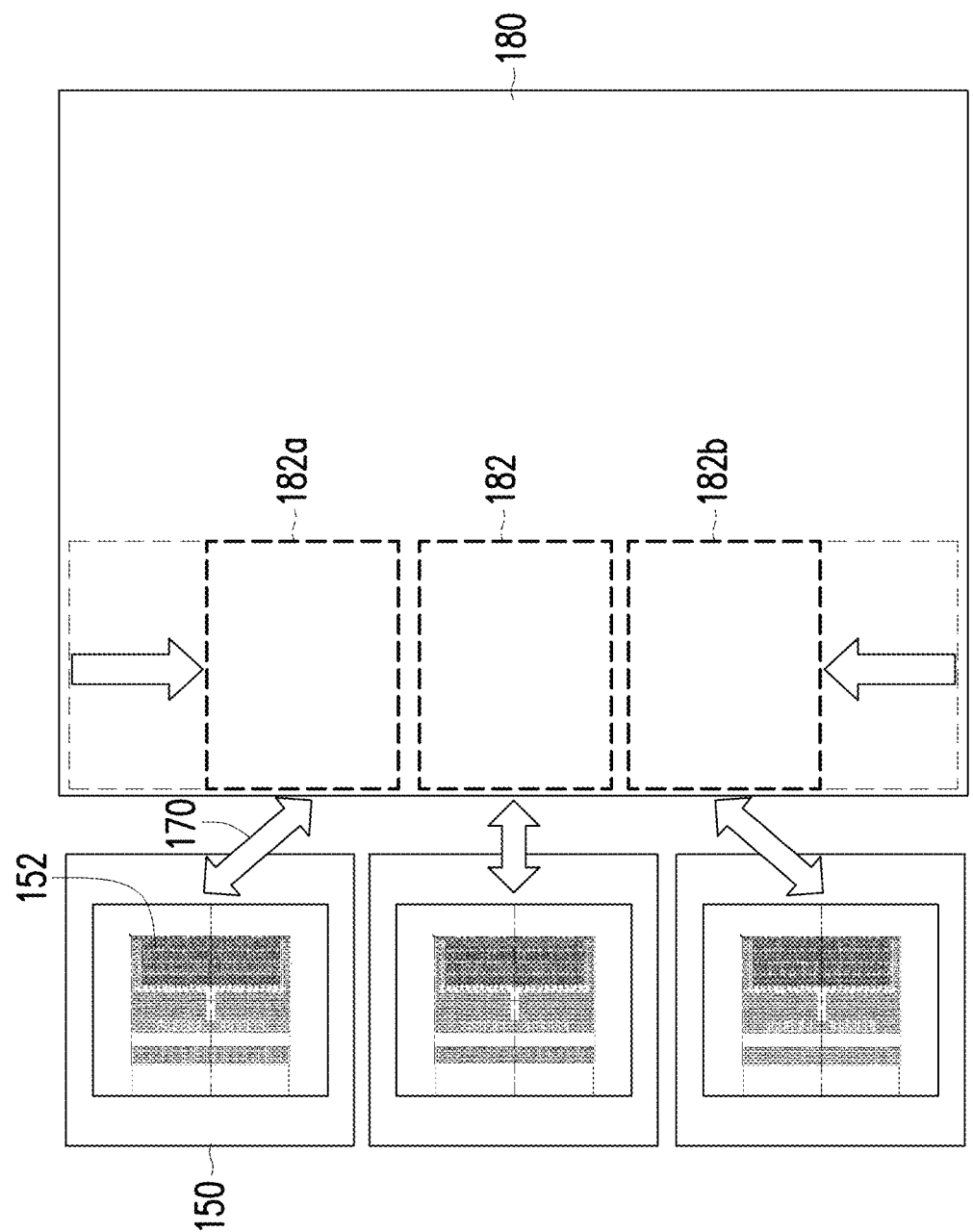
FIG. 10 is a drawing, schematically illustrating a routing structure between two groups of dies, according to an embodiment of the invention.

For the general application of the routing structure 170 in the whole circuit, a group of die 150 and a group of 180 may be disposed over the trace layer 110 in connection. FIG. 10 is a drawing, schematically illustrating a routing structure between two groups of dies, according to an embodiment of the invention.

Referring to FIG. 10, in an embodiment, a group of dies 150 are to be connected to the dies 180, which has multiple interfacing edges 182a, 182b, 182c. Each die 150 also include an interfacing edge 152 as the foregoing descriptions. In an example, the die 180 may be a master die with a fixed location. However, the interfacing edges 182a, 182b, 182c may be properly adjusted along the Y direction in accordance with the packaging process. The routing structure 170 with slant routing paths as previously described allows the connection between the dies 150 and the die 180. In the embodiment, the interfacing edges 182a and the interfacing edges 182c as an example are properly shifted along the Y direction. However, the invention is not just limited to the arrangement in FIG. 10. In a further example, each of the interfacing edges 182a, 182b, 182c may belong to a separated die.

Also noted, the interfacing edge in semiconductor structure as an example include connect elements arranged in a pad pattern. The number of the contact elements, corresponding to the routing paths, may also be freely increased in accordance with the increase of the communication bus while the capability of the die is enhanced.

Figure 11:
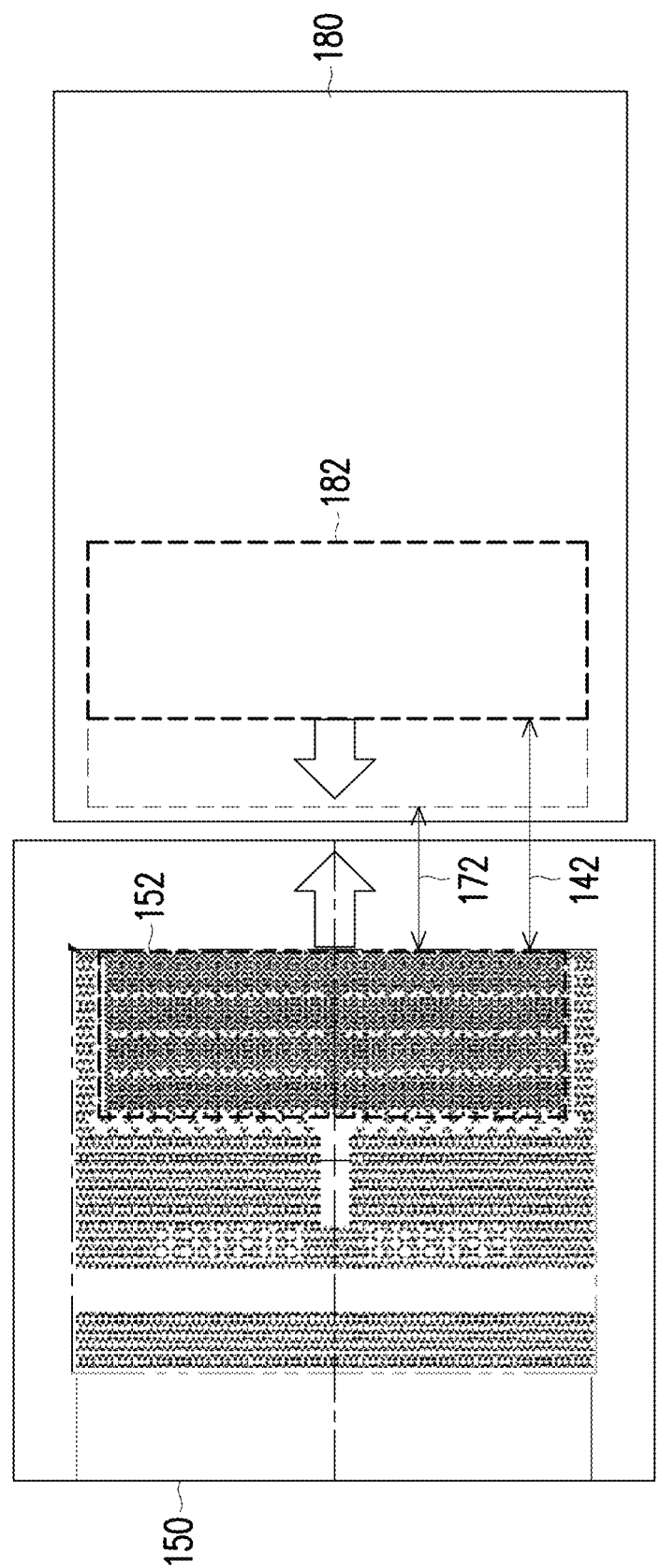
FIG. 11 is a drawing, schematically illustrating an improved effect of a routing structure between dies, according to an embodiment of the invention.

FIG. 11 is a drawing, schematically illustrating an improved effect of a routing structure between dies, according to an embodiment of the invention. Referring to FIG. 8, based on the mechanism in FIG. 4 or FIG. 9, the interfacing edge 182 of the die 180 may be adjusted to be closer to the periphery of the die 180.

In the foregoing description the routing structure 170 with the slant portion may adapt to connection between interfacing edges of the dies. The periphery of the dies 150, 170 may be fixed due to the 2.5D packaging process. However, the interfacing edges 152, 172 may be adjusted in locations to have the connection. The number of the routing paths of the routing structure is not limited by the spacing gap 142 at the X direction.

In further view of fabrication method, the invention also provides a method for arranging routing between dies. In general, the method includes disposing a trace layer on a substrate, wherein a plurality of routing paths is embedded in the trace layer and disposing a first die and a second die on the trace layer as connected by the routing paths. A spacing gap between the first die and the second die is along a first direction and interfacing edges of the first die and the second die are extending along a second direction perpendicular to the first direction. Each of the routing paths is configured to include a first straight portion in parallel to connect to the interfacing edges. The first straight portion has a slant angle with respect to the first direction other than 0° and 90°.

The slant routing path with proper slant angle allows the connection between the dies to be more free arrangement. In addition, the number of the routing path is not constrained to the spacing gap 142 at the X direction.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A routing structure between dies, comprising:
    a trace layer, disposed on a substrate, wherein a plurality of routing paths is embedded in the trace layer; and
    a first die and a second die, disposed on the trace layer and connected by the routing paths,
    wherein a spacing gap between the first die and the second die is along a first direction and interfacing edges of the first die and the second die are extending along a second direction perpendicular to the first direction,
    wherein each of the routing paths has a corresponding wire length along a connection direction from the first die to the second die,
    wherein each of the routing paths has a corresponding wire width perpendicular to the connection direction,
    wherein each of the routing paths connects between the interfacing edges of the first die and the second die, and includes a first straight portion, a second straight portion and a third straight portion in sequence, and is equal in the wire width and the wire length, wherein the first straight portion and the third straight portion are extending along the first direction,
    wherein each of the second straight portions has a first slant angle with respect to the first direction other than 0° and 90°,
    wherein joining interfaces between the first straight portion and the second straight portion and between the second straight portion and the third straight portion have an included angle from the second direction to maintain the wire width being equal,
    wherein each of the joining interfaces is located at a central line of an angle included between the first straight portion and the second straight portion.

2. The routing structure of claim 1, wherein wire pitches between adjacent two of the routing paths are equal.

3. The routing structure of claim 1, wherein the second straight portions are equal in length.

4. The routing structure of claim 3, wherein lengths of the first straight paths are gradually increasing or decreasing with respect to the second direction while lengths of the third straight paths are oppositely gradually decreasing or increasing.

5. The routing structure of claim 4, wherein the lengths of the first straight portions increases to a limited length then a next one of the first straight portions is shrink to a quantity.

6. The routing structure of claim 1,
    wherein the routing paths are divided into a first group and a second group,
    wherein each of the interfacing edges of the first die and the second die is divided into two wire regions corresponding to the first group and the second group, wherein each of the interfacing edges of the first die and the second die includes a functional region without connection to the routing paths.

7. The routing structure of claim 6, wherein the functional region includes a power and/or ground region.

8. The routing structure of claim 6, wherein the second straight portions are equal in length, wherein lengths of the first straight paths of the first group and the second group are gradually increasing or decreasing with respect to the second direction while lengths of the third straight paths of the first group and the second group are oppositely gradually decreasing or increasing.

9. The routing structure of claim 8, wherein the lengths of the first straight portions of the first group increases to a limited length and the lengths of the first straight portions of the second group increasing form a low quantity to a high quantity.

10. The routing structure of claim 9, wherein a length of a beginning one of the first straight portion of the second group is a preset length, so as to have the same wire pitch to a last one of the first straight portions of the first group.

11. A method for arranging routing structure between dies, comprising:
   disposing a trace layer on a substrate, wherein a plurality of routing paths is embedded in the trace layer; and
   disposing a first die and a second die on the trace layer as connected by the routing paths,
   wherein a spacing gap between the first die and the second die is along a first direction and interfacing edges of the first die and the second die are extending along a second direction perpendicular to the first direction,
   wherein each of the routing paths has a corresponding wire length along a connection direction from the first die to the second die,
   wherein each of the routing paths has a corresponding wire width perpendicular to the connection direction,
   wherein each of the routing paths connects between the interfacing edges of the first die and the second die, and includes a first straight portion, a second straight portion and a third straight portion in sequence, and is equal in the wire width and the wire length, wherein the first straight portion and the third straight portion are extending along the first direction,
   wherein each of the second straight portions has a first slant angle with respect to the first direction other than 0° and 90°,
   wherein joining interfaces between the first straight portion and the second straight portion and between the second straight portion and the third straight portion have an included angle from the second direction to maintain the wire width being equal,
   wherein each of the joining interfaces is located at a central line of an angle included between the first straight portion and the second straight portion.

12. The method for arranging routing structure of claim 11, wherein wire pitches between adjacent two of the routing paths are set to be equal.

13. The method for arranging routing structure of claim 11, wherein the second straight portions are set to be equal in length.

14. The method for arranging routing structure of claim 13, wherein lengths of the first straight paths are set to be gradually increasing or decreasing with respect to the second direction while lengths of the third straight paths are set to be oppositely gradually decreasing or increasing.

15. The method for arranging routing structure of claim 14, wherein when the lengths of the first straight portions increases to a limited length then a next one of the first straight portions is shrink to a quantity.

16. The method for arranging routing structure of claim 11,
   wherein the routing paths are divided into a first group and a second group,
   wherein each of the interfacing edges of the first die and the second die is divided into two wire regions corresponding to the first group and the second group,
   wherein each of the interfacing edges of the first die and the second die includes a functional region without connection to the routing paths.

17. The method for arranging routing structure of claim 16, wherein the functional region as arranged includes a power and/or ground region.

18. The method for arranging routing structure of claim 16, wherein the second straight portions are set to be equal in length, wherein lengths of the first straight paths of the first group and the second group are set to be gradually increasing or decreasing with respect to the second direction while lengths of the third straight paths of the first group and the second group are oppositely gradually decreasing or increasing.

19. The method for arranging routing structure of claim 18, wherein the lengths of the first straight portions of the first group increases to a limited length and the lengths of the first straight portions of the second group are increasing form a low quantity to a high quantity.

20. The method for arranging routing structure of claim 19, wherein a length of a beginning one of the first straight portion of the second group is a preset length, so as to have the same wire pitch to a last one of the first straight portions of the first group.

* * * * *